United States Patent
Ditri et al.

(10) Patent No.: US 10,602,635 B2
(45) Date of Patent: Mar. 24, 2020

(54) TWO-PHASE FLUID-ACTUATED COOLING DEVICE, SYSTEM, AND METHOD

(71) Applicant: Lockheed Martin Corporation, Bethesda, MD (US)

(72) Inventors: John Ditri, Huntingdon Valley, PA (US); Jay H. Ambrose, Santa Cruz, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/875,538

(22) Filed: Jan. 19, 2018

(65) Prior Publication Data

US 2019/0230808 A1 Jul. 25, 2019

(51) Int. Cl.
*H05K 7/20* (2006.01)
*H05K 7/14* (2006.01)

(52) U.S. Cl.
CPC ....... *H05K 7/1404* (2013.01); *H05K 7/20336* (2013.01); *H05K 7/20454* (2013.01); *H05K 7/20672* (2013.01)

(58) Field of Classification Search
None
See application file for complete search history.

(56) References Cited

U.S. PATENT DOCUMENTS

| | | | |
|---|---|---|---|
| 4,480,287 A | 10/1984 | Jensen | |
| 4,971,570 A * | 11/1990 | Tolle | H05K 7/1404 361/709 |
| 5,711,628 A | 1/1998 | Fletcher | |
| 5,720,339 A * | 2/1998 | Glass | B64G 1/506 165/104.26 |
| 8,215,377 B1 | 7/2012 | Monson et al. | |
| 8,780,556 B1 * | 7/2014 | Ditri | H05K 7/1404 165/80.2 |
| 2008/0218980 A1 * | 9/2008 | Tracewell | H05K 7/20672 361/713 |
| 2010/0066178 A1 * | 3/2010 | Lower | H02K 44/04 310/11 |
| 2011/0141692 A1 * | 6/2011 | Bult | H05K 7/1404 361/700 |
| 2012/0069526 A1 * | 3/2012 | Tissot | H05K 7/20809 361/720 |

(Continued)

FOREIGN PATENT DOCUMENTS

EP   0 390 053 A1   10/1990

OTHER PUBLICATIONS

Extended European Search Report dated Jun. 14, 2019 in European Patent Application No. 19152769.6, 12 pages.

*Primary Examiner* — Courtney L Smith
(74) *Attorney, Agent, or Firm* — Oblon, McClelland, Maier & Neustadt, L.L.P.

(57) ABSTRACT

An electronics circuit card system includes a flexible elongated hollow receptacle; a working fluid disposed within the flexible elongated hollow receptacle; one or more wicking structures formed within an interior hollow region of the flexible elongated hollow receptacle, wherein the one or more wicking structures are configured to circulate the working fluid within the flexible elongated hollow receptacle and expand the flexible elongated hollow receptacle against an electronics circuit card; and a chassis configured to hold the flexible elongated hollow receptacle against the electronics circuit card.

15 Claims, 14 Drawing Sheets

(56) References Cited

U.S. PATENT DOCUMENTS

| | | |
|---|---|---|
| 2013/0077232 A1 | 3/2013 | Nordin et al. |
| 2016/0128227 A1* | 5/2016 | Gernert .............. H05K 7/20336 |
| | | 165/104.21 |
| 2017/0142863 A1* | 5/2017 | Hurbi ................ B29C 45/14598 |
| 2017/0245392 A1* | 8/2017 | Bilski, Jr. .......... H05K 7/20336 |
| 2017/0248994 A1 | 8/2017 | Pruett |
| 2017/0251572 A1* | 8/2017 | Kirk .................... H05K 7/1404 |
| 2017/0339805 A1* | 11/2017 | Lassini ................ H05K 7/2039 |
| 2018/0049307 A1* | 2/2018 | de Bock .............. H05K 1/0203 |

\* cited by examiner

TWO-PHASE FLUID-ACTUATED COOLING DEVICE, SYSTEM, AND METHOD

TECHNICAL FIELD

Embodiments described herein include circuit card retaining devices, systems, and methods. In particular, embodiments include cooling devices, systems, and methods for printed circuit boards and printed wiring boards.

BACKGROUND

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

Adequate cooling for electronic equipment with a large number of printed wiring boards (PWBs) or printed circuit boards (PCBs), also known as "circuit cards" is critical for preventing damage and for extending component service life. The large amount of heat generated by components arranged on circuit cards often benefits from separate conductive cooling systems to control the operating temperature of the equipment. The cooling systems can include heat exchangers embodied as heat-conducting chassis or frames. Chassis may be air-cooled or liquid-cooled, or may include a large thermal capacity.

Circuit cards are conventionally held on their peripheries within slots formed by opposing cold walls of a chassis. The circuit cards are clamped into place along their opposing edges via expanding wedge locks, also called circuit card retainers. Conventional circuit card retainers suffer from several significant drawbacks. For example, as recognized by the present inventors, circuit card retainers do not exert uniform pressure along the length of the circuit card edge(s) as a result of its multi-piece construction, nor does the multi-piece construction provide for efficient heat conduction and therefore, heat sinking from the circuit card primarily results only from conduction on a side opposite the circuit card retainer and its contact with the cold wall. Circuit card retainers also do not allow for easy extraction of the circuit cards because they often do clot fully contract back to their original non-expanded height, even when properly unlocked. In, addition, the active cooling in many systems comes from coolant channels formed in the chassis walls, which can be arranged at a relatively large distance from the circuit card. This distance can lead to significant thermal rise between the fluid in the channels and the circuit card edges.

SUMMARY

In an exemplary embodiment, an electronics circuit card retainer includes a flexible elongated hollow receptacle; a working fluid disposed within the flexible elongated hollow receptacle; and a flow circulator configured to circulate the working fluid within the flexible elongated hollow receptacle and expand the flexible elongated hollow receptacle against at a electronics circuit card within the electronics circuit card retainer.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many f the attendant advantages thereof will be readily obtained as the same becomes better understood by reference to the following detailed description when considered in connection with the accompanying drawings, wherein.

DETAILED DESCRIPTION

The following descriptions are meant to further clarify the present disclosure by giving specific examples and embodiments of the disclosure. These embodiments are meant to be illustrative rather than exhaustive. The full scope of the disclosure is not limited to any particular embodiment disclosed in this specification, but rather is defined by the claims.

It will be appreciated that in the development of any such actual implementation, numerous implementation-specific decisions need to he made in order to achieve the developer's specific goals, such as compliance with application- and business-related constraints, and that these specific goals will vary from one implementation to another and from one developer to another.

Reference is made herein to the accompanying drawings that show, by way of illustration, specific embodiments in which the present disclosure may be practiced. The various embodiments, although different, are not necessarily mutually exclusive. Further more a particular feature, structure, or characteristic described herein in connection with one embodiment may be implemented with other embodiments without departing from the scope of the disclosure. In addition, the location or arrangement of individual elements within each disclosed embodiment may be modified without departing from the scope of the disclosure.

The figures and description of the present disclosure have been simplified to illustrate elements that are relevant for a clear understanding of the disclosure, while eliminating for purposes of clarity, many other elements found in printed wiring board author printed circuit board (PWB/PCB) retaining and/or cooling systems. However, because such elements are known in the art and because they do not facilitate a better understanding of the present disclosure, a discussion of such elements is not provided herein. The disclosure herein is directed to all such variations and modifications known to those skilled in the relevant art.

Figure 1A:
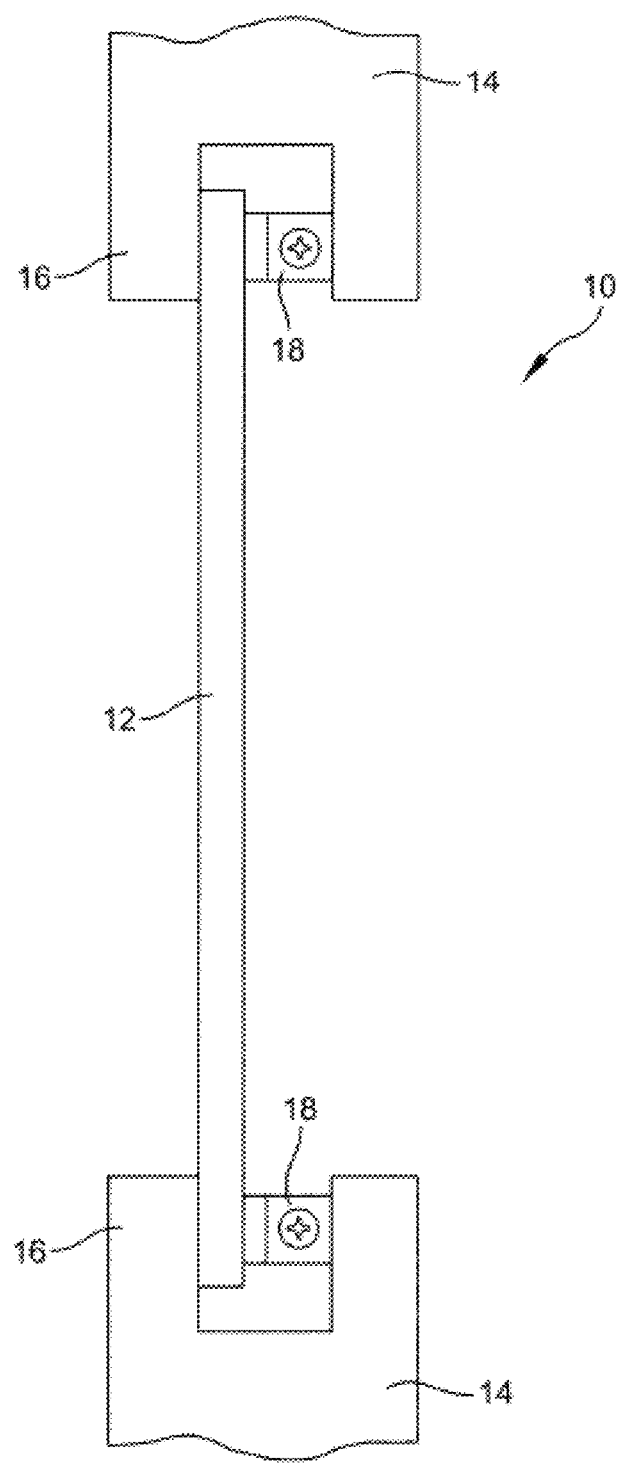
FIG. 1A is a schematic illustrating a partial view of card cooling system according to one embodiment.

FIG. 1A is a schematic illustrating a partial view of card cooling system 10 using conventional expanding circuit card retainers. The card cooling system 10 includes a cooling chassis 14 having a plurality of elevated wall sections 16 formed within the cooling chassis 14, which defines a plurality of slots. Each slot is configured to accept at least one circuit card 12 (e.g. a PWB or a PCB). Circuit cards 12 can be held within the slots by expanding circuit card retainers 18. The circuit card retainers 18 include expanding assemblies which clamp an edge of circuit card 12 against an opposing wall of the slot.

Figure 1B:
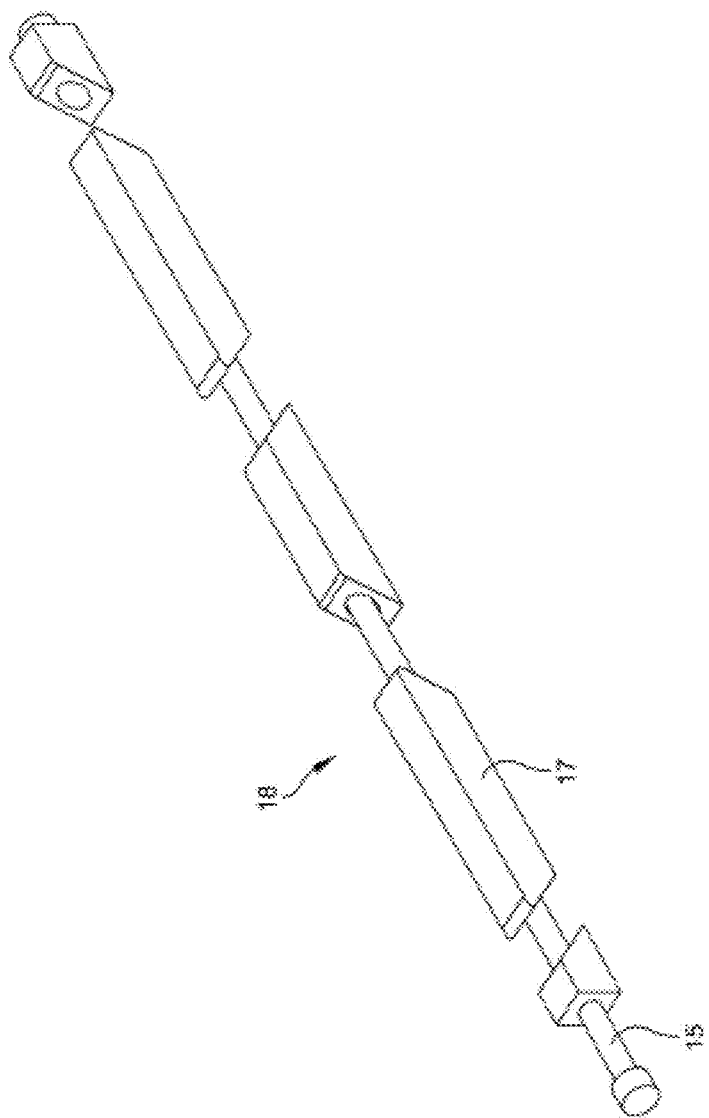
FIG. 1B is a schematic illustrating an exemplary expanding circuit card retainer according to one embodiment.

FIG. 1B is a schematic illustrating an exemplary expanding circuit card retainer 18 in more detail. Circuit card retainer 18 can include a screw or bolt 15 configured to freely pass through several wedge-shaped body sections 17, including a front wedge, one or more center wedges, and a rear wedge having a complementary threaded hole formed herein. Tightening of the screw 15 forces the wedge-shaped body sections 17 to contact and slide against each other, causing their displacement or expansion relative to one another. This expansion provides the locking function to hold the circuit card 12 between the expanding circuit card retainer 18 and a wall section of the cooling chassis 14. Removal of the circuit card 12 requires the loosening of screw 15, which allows the wedge-shaped body sections 17 to contract or re-align, relative to one another, alleviating the force on the circuit card 12. After loosening the screw friction between the wedge-shaped body sections can keep them locked in place relative to one another. This can prevent removal of the circuit card.

Fluid-actuated circuit card retainers, such as pneumatically- or hydraulically-actuated circuit card retainers offer improved mechanical and thermal characteristics. An exemplary circuit card retainer includes a tillable or inflatable bladder having at least one port for connecting to a supply of pressurized fluid, such as air, water, or other coolants. The bladder is configured to be placed within a card slot of a cooling system and selectively pressurized to secure the circuit card within the card slot.

Figure 2A:
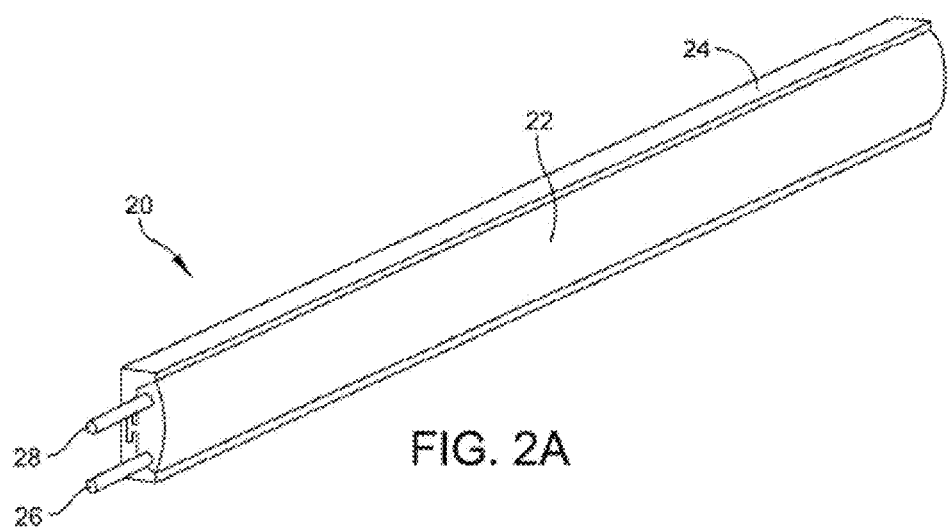
FIG. 2A is a schematic illustrating a front side of an exemplary circuit card retainer according to one embodiment.
Figure 2B:
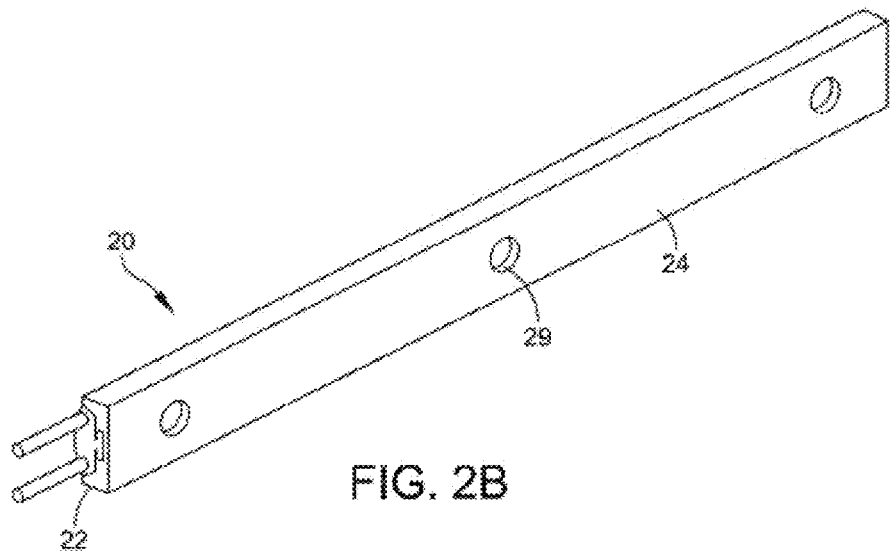
FIG. 2B is a schematic illustrating a back side of an exemplary circuit card retainer according to one embodiment.

FIGS. 2A and 2B are schematics illustrating an exemplary circuit card retainer 20. Circuit card retainer 20 includes a bladder 22 mounted to or otherwise associated with a corresponding body or frame 24, such as a wedge lock. Bladder 22 includes at least a partially-hollow construction, such that it can be selectively filled with a fluid, such as a gas or a liquid. Bladder 22 includes an inlet port 26 and an outlet port 28 for facilitating the introduction of fluid into and out of bladder 22.

FIGS. 2A and 2B illustrate an inlet port 26 and outlet port 28 at one end of the bladder 22. However, an inlet hose and an outlet hose extend beyond the end of the bladder 22 into the bladder 22. In one embodiment, the inlet hose and outlet hose extend up to the entire length of bladder 22. This is to provide homogenous mixing of a working fluid prior to exiting the bladder 22.

Feed-throughs can be provided in the form of tubes, either for charging the bladder volume in which coolant fluid is supplied externally. These would likely be formed directly into the bladder wall material, which would be seam-welded to provide a hermetically-sealed bladder volume.

Bladder 22 can generally be flexible, such that the introduction of a pressurized fluid into a cavity of bladder 22 causes at least a portion of bladder 22 to expand, such as away from frame 24. Expansion of bladder 22 can be attributed to at least one of the stretching or deformation of at least a portion of a wall of bladder 22, or through a change in the outer dimensions of bladder 22 as it transitions from a generally collapsed or unfilled state to an inflated or filled state.

Bladder 22 may be wholly or partially thrilled from materials having generally flexible or elastic characteristics, such as rubber or other suitable polymers. The material of bladder 22 can also be selected according to its heat transfer characteristics. In some embodiments, only a portion of bladder 22 may be flexible or elastic. For example, a wall segment of bladder 22 may include a generally flexible and/or elastic characteristic, while the remainder of bladder 22 can include a more stiff and/or inelastic characteristic such that pressurization of bladder 22 results in the expansion of generally only the flexible segment thereof. The inelastic portion of bladder 22 may be formed by, for example, selectively thinning a section of a wall of bladder 22.

Frame 24 can include, any suitable shape, such as an elongated body having a complementary profile formed therein for adjoining with bladder 22. Frame 24 can include apertures 29 for attaching frame 24 and/or bladder 22 to a circuit card or a portion of a cooling chassis. Frame 24 can be formed from any suitable material, such as metals, metal alloys, composites, or polymers. In order to promote heat transfer, frame 24 may be formed from a material having high thermal conductivity.

Figure 2C:
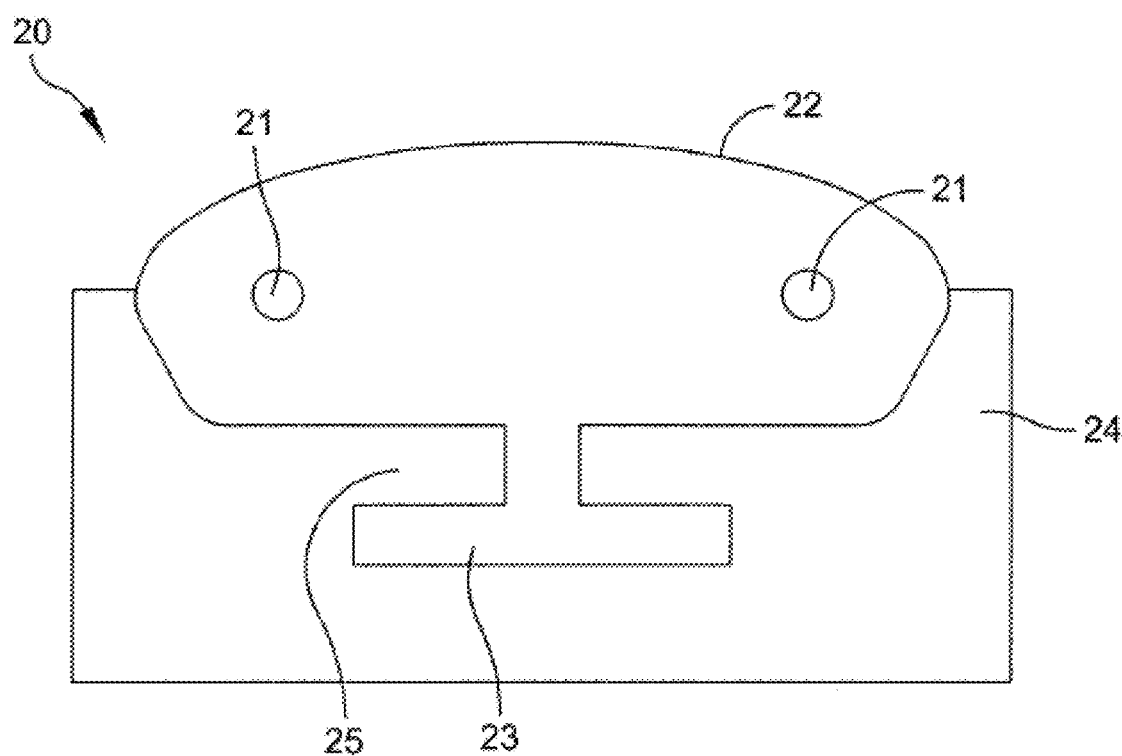
FIG. 2C illustrates a cross-sectional view of an exemplary card retainer according to one embodiment.

FIG. 2C illustrates a cross-sectional view of a card retainer 20 having a bladder 22 with a generally elliptical geometry. The bladder 22 can be configured to be arranged within a correspondingly-sized recess formed in frame 24. In the exemplary embodiment, the bladder 22 and frame 24 are attached via a T-shaped section 23 formed integrally with the bladder 22, and a corresponding T-shaped void or slot formed within the frame 24. The bladder 22 and frame 24 can be secured to one another. While an interlocking arrangement is illustrated, other suitable configurations, such as other tongue-and-groove arrangements or fasteners can be used for attaching or otherwise positioning bladder 22 with respect to frame 24 without departing from the scope of the disclosure.

Figure 2D:
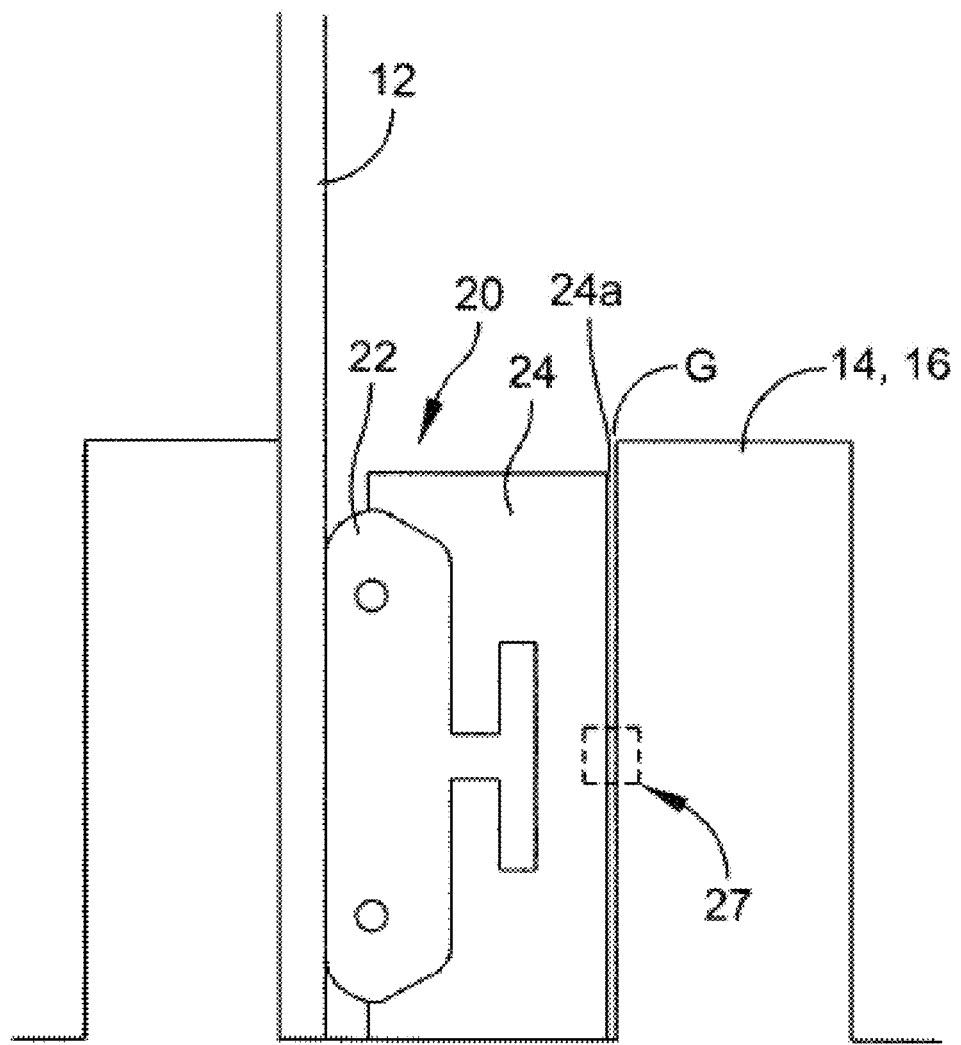
FIG. 2D illustrates an exemplary card retainer abutting or facing a wall section of a chassis according to one embodiment.

FIG. 2D illustrates a card retainer 20 arranged with a frame 24 abutting or facing a wall section 16 of a chassis 14. The bladder 22 abuts or faces circuit card 12. The card retainer 20 can be fixed to the wall section 16 via a fastener 27. In the exemplary embodiment, bladder 22 is in an expanded or pressurized state. There may or may not be an actual gap G between the body of the frame 24 and the facing wall section 16 of the chassis 14. For purposes of enhanced heat transfer, the structure may be configured such that surface edge 24a of frame 24 is in contact with opposing wall 16 along its entire length.

Figure 2E:
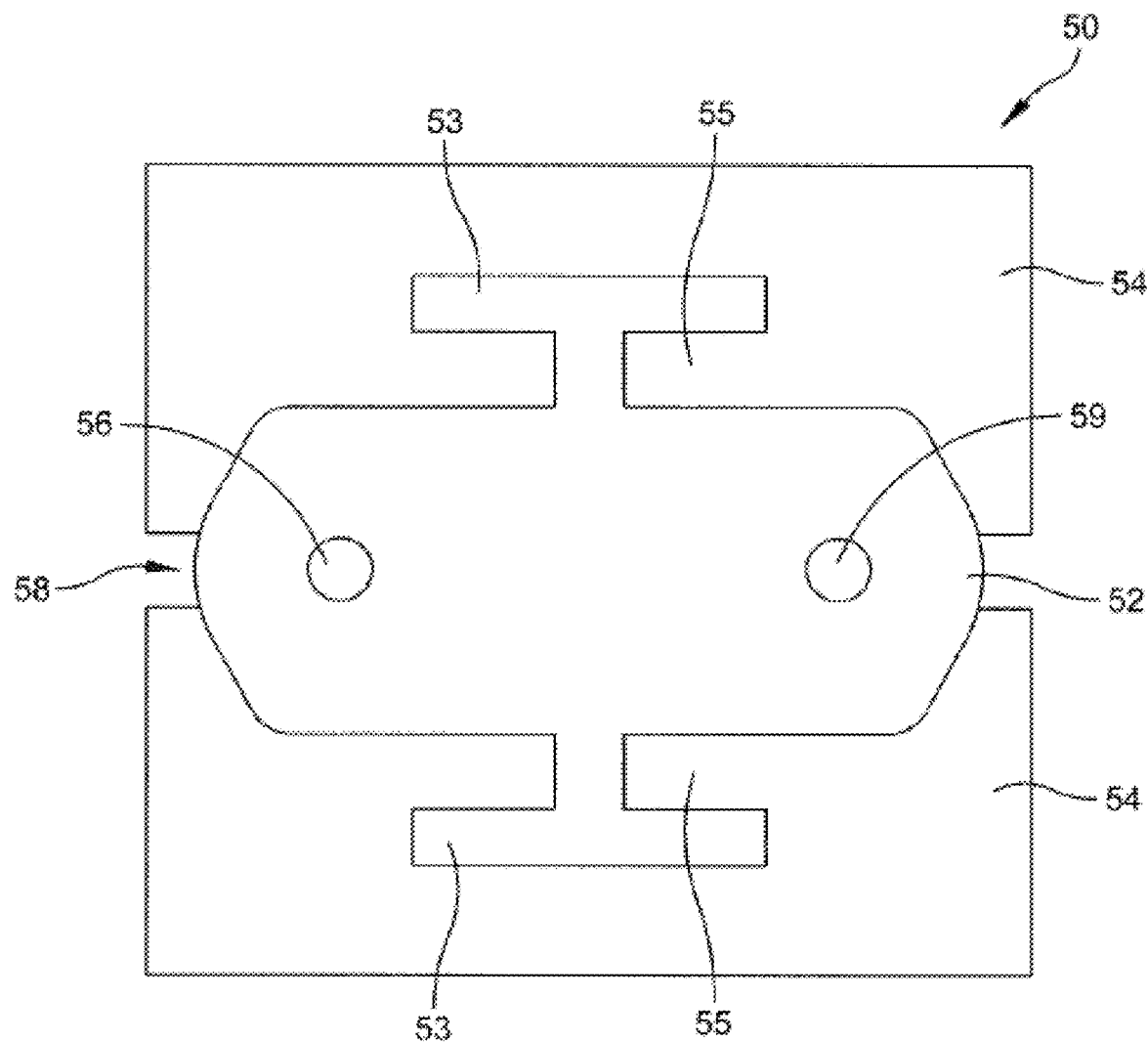
FIG. 2E illustrates an exemplary card retainer arranged between first and second frames according to one embodiment.

FIG. 2E illustrates a card retainer 50 having a bladder 52 arranged between first and second frames 54. Bladder 52 may be attached to frames 54 via complementary, interlocking features 53 and 55. Likewise, bladder 52 may include a cavity having passages 56 and 59 formed therein for allowing the passage of fluid there through or for storing a volume of fluid therein. Bladder 52 can be expanded, thus increasing the gap 58 between frames 54 to apply pressure to a card and a wall of a cooling chassis arranged on outer sides of frames 54. Frames 54 can be attached is guide pins to ensure the frames 54 maintain proper alignment during expansion and contraction. The guide pins can also serve as conduits for additional heat transfer between the frames 54.

Figure 3A:
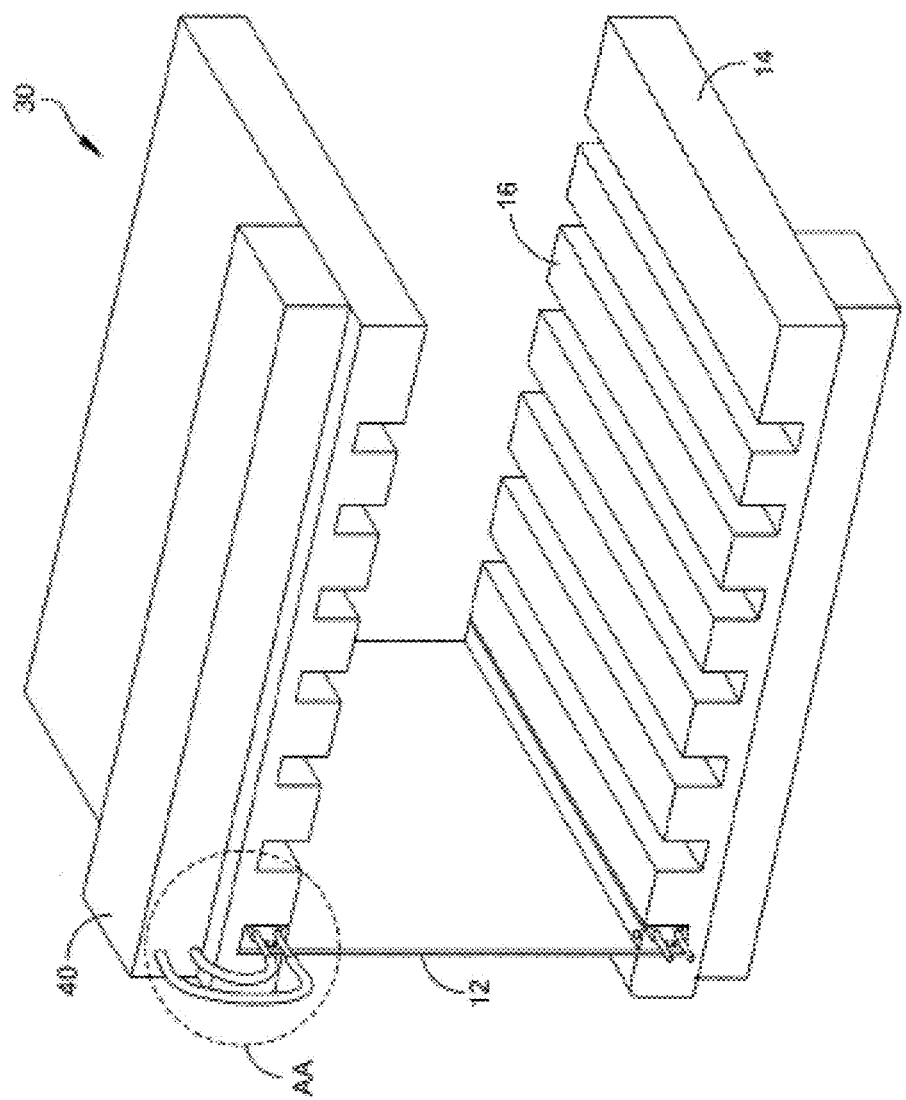
FIG. 3A is a schematic illustrating a circuit card cooling system according to one embodiment.

FIG. 3A is a schematic illustrating a circuit card cooling system 30 according to embodiments described herein. Circuit card cooling system 30 includes a cooling chassis 14 having upper and lower cold wall portions to form elevated walls 16. Elevated walls 16 may define a plurality of slots arranged between upper and lower cold wall portions for accepting circuit cards 12 therein. Chassis 14 and/or elevated walls 16 can include internal cooling passages (not shown) for carrying air, water, or other types of coolant there through. Circuit card cooling system 30 also includes a heat exchanger 40, which can include one or more pumps (not shown) for supplying pressurized fluid to each circuit card retainer. Heat exchanger 40 can be arranged in thermal contact with cooling chassis 14 for providing additional cooling to the circuit card cooling system 30.

Figure 3B:
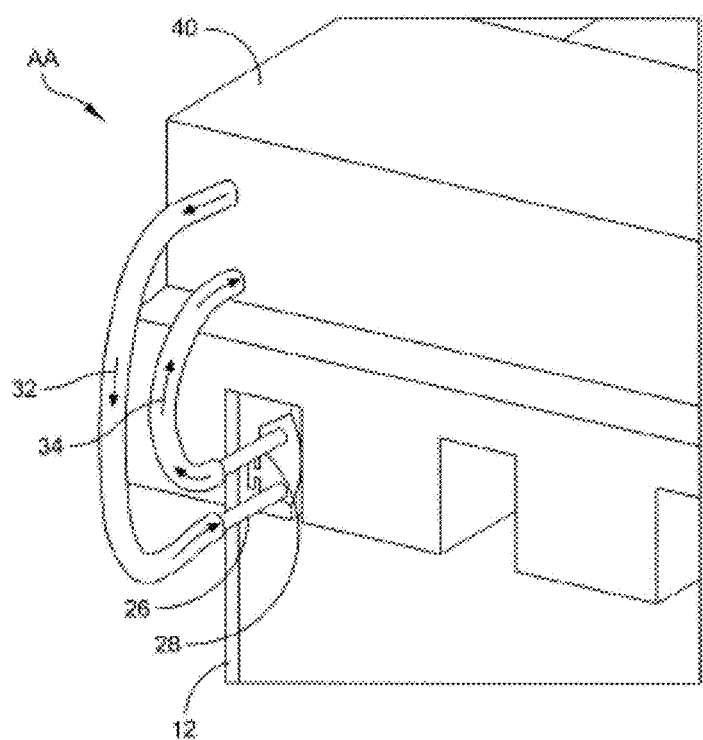
FIG. 3B is a schematic of a heat exchanger with an outlet supply line and an inlet supply line according to one embodiment.

FIG. 3B is a schematic of heat exchanger 40 with an outlet supply line 32 for providing pressurized fluid to the inlet port 26 of the circuit card retainer and an inlet supply line 34 for receiving a return flow of fluid from outlet port 28 of the circuit card retainer. FIG. 3B is a schematic detailed view illustrating the circular flow of coolant or fluid between the heat exchanger 40 and the circuit card retainer. The fluid serves as both a pressure source to expand the bladder 22 of the circuit card cooling system 30 and force the circuit card 12 against the chassis wall, as well as a source of cooling fluid into which heat from the circuit card 12 will be absorbed.

Circuit card cooling system 30 of FIG. 3A illustrates only one circuit card 12 and associated upper and lower circuit card retainers supplied by associated upper and lower heat exchangers 40. However, circuit card cooling systems 30 described herein include provisions for multiple circuit cards 12. For example, any number of heat exchangers 40, manifolds for distributing pressurized fluids to a plurality of circuit card retainers, and various associated pumps and pressure-regulating devices may be included for a circuit card cooling system 30 in embodiments described herein. Circuit card cooling system 30 can include for example, mechanical valves for controlling the flow of pressurized fluid to the circuit card retainers. Other circuit card cooling systems 30 may be automated or semi-automated and include at least one temperature sensor for monitoring the temperature of the fluid or the circuit cards 12. Circuit card cooling system 30 may be responsive to the output of the sensor for varying the temperature of the fluid via heat exchanger 40, thus controlling the operating temperature of the circuit cards 12. Circuit card cooling system 30 may also include at least one pressure sensor for monitoring the pressure of the fluid within circuit card cooling system 30. Data from the pressure sensor may be used in conjunction with circuit card cooling system 30 and be used to adjust the clamping force on the circuit cards 12, or to adjust the flow of fluid through the circuit card retainers.

Embodiments herein also describe a bladder and fluid delivery system configured as a flexible and expandable heat pipe system using a working fluid having a two-phase material property. This provides an improved heat transfer at the interface between the circuit card 12 and the chassis 14.

In one embodiment, a system similar to the circuit card cooling system 30 is used. An external fluid pump (not illustrated in FIG. 3A or FIG. 3B) delivers a working fluid, such as ammonia, propane, butane, Novec HFE 7000, or similar fluid to an expandable bladder. When the working fluid enters the expandable bladder, the pressure within the expandable bladder provides a clamping force on the associated circuit card 12. The heat absorbed by the expandable bladder from the adjacent circuit card 12 causes evaporation of some of the working fluid flowing within the expandable bladder to form a two-phase material of liquid and vapor. This action is similar to a rigid heat pipe operation. The evaporation provides an effective heat transfer mechanism for removing heat from the circuit card 12 with a minimal temperature rise. This action effectively keeps the temperature of the circuit card 12 constant and provides for a reduced component temperature on the circuit card 12. Material of the expandable bladder can include pure materials, composite materials, or layered materials.

Figure 4:
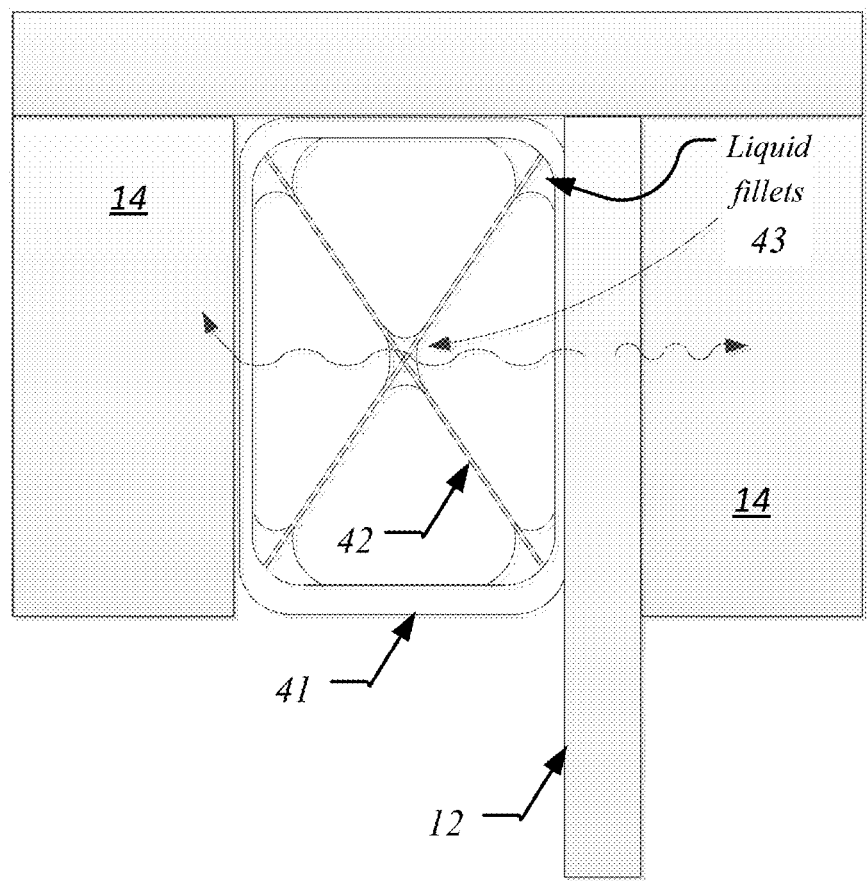
FIG. 4 is a cross-sectional view of an exemplary expandable bladder according to one embodiment.

FIG. 4 is a cross-sectional view of an exemplary expandable bladder 41 according to embodiments described herein. The expandable bladder 41 is positioned within a slot of a chassis 14. A circuit card 12 is positioned in the slot between a wall of the chassis 14 and the expandable bladder 41. The expandable bladder 41 can also be encased in a support frame, such as the frames illustrated in FIGS. 1A and 1B and FIGS. 2A-2E. In addition, the chassis 14 can be screwed to the circuit card 12 to support the circuit card 12 in low pressure applications and to make it easier to assemble a system of circuit cards 12.

In FIG. 4, there is no active fluid delivery system, i.e. no pump to provide the working fluid to the expandable bladder 41. Instead, the expandable bladder 41 is pre-charged with a predetermined amount of working fluid. The expandable bladder 41 can be charged in-situ with the circuit card 12 mounted in the chassis 14. Alternatively, the circuit card 12 can be charged separately and installed at a reduced temperature in a deflated or frozen state, which will depend on the selected working fluid saturation properties. The fixed charge of the working fluid can be inserted into the expandable bladder 41 and sealed.

The expandable bladder 41 is configured with internal features to promote wicking of the liquid phase of the working fluid. Internal ribs 42 provide an enhanced wicking action within the expandable bladder 41. The internal ribs 42 allow for fluid transport from the cold "condenser" side of the expandable bladder 41 in contact with a wall of the chassis 14 to the hot "evaporator" side of the expandable bladder 41 in contact with the circuit card 12. Vapor transport occurs from the hot "evaporator" side to the cold "condenser" side naturally, even without the internal ribs 42. This occurs from generated vapor filling the space within the expandable bladder 41. When the vapor touches all of the internal surfaces including the cold "condenser" side, it will condense to a liquid at the cold "condenser" side. In order for the liquid to return to the hot "evaporator" side, the internal ribs 42 facilitate capillary action forces to transport the liquid to the hot "evaporator" side. The expandable bladder 41 provides a continuous heat transfer loop of the two-phase material. Since evaporation takes place at a constant temperature, the temperature rise across, the expandable bladder 41 filled with a two-phase material will be minimal, which greatly reduces the thermal impedance between the circuit card 12 and the wall of the chassis 14.

FIG. 4 also illustrates liquid fillets 43 located at the corners between the internal ribs 42 and the inner surface of the expandable bladder 41 and at the central intersection of the internal ribs 42. The proportion of the liquid phase and the vapor phase of the two-phase material will vary during operation of the PCB. As the temperature of the circuit card 12 increases, there will be an increase in the amount of the vapor phase. As the vapor comes into contact with the cooler side of the wall of the chassis 14, the vapor will be cooled and condense into a liquid, thereby increasing the amount of the liquid phase.

The expandable bladder 41 is in contact with the PCB. The portion of fluid inside the expandable bladder 41 that is next to the PCB will be heated from the active electronic components on the PCB, which will cause the fluid to evaporate. When the fluid becomes a vapor, it permeates through openings in the internal ribs 42. When the vapor within the expandable bladder 41 reaches the cold side of the chassis 14 away from the mounted circuit card 12, the vapor will condense, and form liquid fillets within the corner regions formed by the intersection of the expandable bladder 41 and the internal ribs 42. The wicking action will cause the newly-formed liquid to be drawn towards the hot side of the chassis 14 next to the mounted circuit card 12. The wicking process continues to draw the liquid towards the circuit card 12 side where it becomes vapor, permeates to the cold side of the chassis 14, condenses, and is wicked.

The geometries illustrated in FIG. 4 allow the two-phase material to naturally wet into the small crevices and curvatures to provide a capillary pumping force. This force passively moves the two-phase material from the cooling point here the liquid accumulates to create a flatter interface. The condensed fluid permeates to the warmer point where it evaporates and leaves the area. The wicking process continues in motion to remove heat from the circuit card 12.

The internal ribs 42 (which form an "X" in FIG. 4) cart be formed of a mesh material and texture that function as wicking, structures. In one embodiment, the mesh material can have porosity features with a predetermined degree of porosity. As a portion of the internal rib 42 is wetted by the condensed fluid, the mesh of the internal rib 42 continues to draw the fluid.

The movement or permeation of the fluid gravitates towards the hot side of the chassis 14 to cool the circuit card 12 and become vaporized again. Capillary forces cause a continuous permeation of the two-phase material within the expandable bladder 41 to evaporate on the hot side of the chassis 14 and to condense on the cold side of the chassis 14. In one embodiment, gravitational forces also assist with the continuous heat transfer loop.

The material of the expandable bladder 41 includes, but is not limited to pure materials, composite materials, and layered materials. High-density polyethylene and PTFE have properties of flexibility, strength, and are compatible with two-phase materials used with embodiments described herein. The expandable bladder 41 materials have a finite permeability to gases, which usually require them to be metalized. Metalized films used for packaging and other applications can be employed, such as Valeron Strength™ film, which is highly puncture resistant and tear resistant. Metalized polymer films have a high elongation, which can exceed 100%.

In another embodiment, the expandable bladder 41 can be high-density polyethylene laminated with aluminum or an aluminum composite. The thickness of the aluminum lining can be approximately 0.003 inches and thicker. The aluminum layer provides an impermeable surface and the polyethylene combined with the aluminum lining provides a very durable and puncture-resistant material with high strength and the, ability to withstand high pressures.

Porous materials, such as meshes, sintered powders, and fibrous materials can be attached or laminated to the expandable bladder 41 to provide additional wicking. The evaporation coefficients of the two-phase material can be increased by providing additional surface area for the wicking process. Porosities of the porous wicking material can range from 25-70%.

An anticipated bladder volume used with a single circuit card 12 can be in the range of 10-100 cc. It would be entirely filled with pressurized liquid for a conventional single-phase fluid. For a two-phase material used with embodiments described herein, the quantity of fluid per expandable bladder 41 can be in the range of 3-8 grams. The expandable bladder 41 can include 10-40% liquid by volume and the remainder of the expandable bladder 41 would be vapor. The amount of two-phase material within the expandable bladder 41 is also determined by a particular application. For example, if greater distances are involved in heat transfer, a larger volume of two-phase material within the expandable bladder 41 would probably be desirable. In addition, the size of the expandable bladder 41 can be varied to more accurately and effectively provide heat transfer.

Two-phase materials can be primarily pure component working fluids used in room temperature heat pipe applications. Examples include water, ammonia, propane, and proprietary refrigerants, such as HFE. Water can be used for higher temperature electronics since it needs to reach above 100 degrees C. to have a saturation pressure above one atmosphere. Proprietary refrigerants are attractive since they are typically non-toxic and non-flammable. They are also available in a range of boiling points to shift the saturation pressure curve to a desired range.

Figure 5:
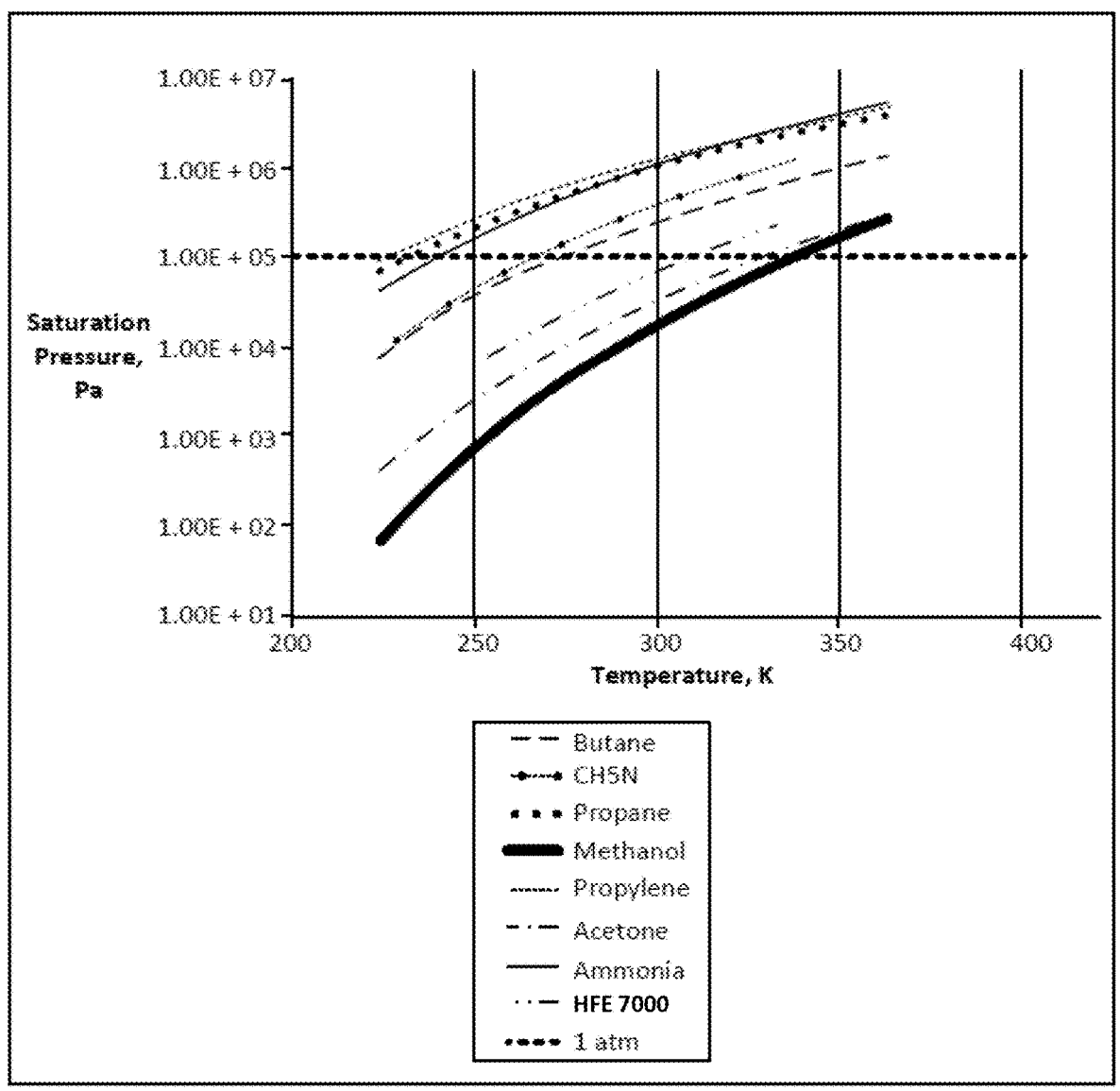
FIG. 5 is a graph illustrating the saturation pressure curves for various exemplary two-phase materials according to one embodiment.

FIG. 5 is a graph illustrating the saturation pressure curves for various exemplary two-phase materials that can be used with embodiments described herein. The area above each curve represents the liquid phase for the associated two-phase material. The area below each curve represents the vapor phase for the associated two-phase material. For example, acetone changes from a liquid phase to a vapor phase at a temperature of 250 K and a pressure of approximately 1400 Pa. As the temperature increases, the saturation pressure also increases. For acetone, at a temperature of 350 K, the saturation pressure is approximately 130,000 Pa.

In FIG. 5, methanol exhibits the lowest saturation curve and propylene exhibits the highest saturation curve. The saturation pressure curve of a two-phase material can be used to determine the optimum two-phase material to be used in the expandable bladder 41 for a particular application. A two-phase material can be selected based on the amount of charge or the flow rate in an active heat transfer loop. One of the drivers in selecting a two-phase material is the saturation temperature at an associated desired working pressure. For example, a pressure of 10 psig may be needed to obtain an adequate clamping force applied to the expandable bladder 41. At that pressure, a two-phase material is needed to evaporate at a reasonable temperature to keep the electronic components on the circuit card 12 cool enough, such as 40 degrees C. If a two-phase material is selected that requires an excessive temperature to evaporate (such as 100 degrees C.) at the given pressure, it will not provide a low enough temperature for the electronic components.

The pressure of a two-phase material within the expandable bladder 41 determines the amount of clamping force between the expandable bladder 41 and the circuit card 12. The saturation curve then determines what temperature the two-phase material needs at the associated working pressure in order to evaporate. For example, an electronic device that operates near room temperature needs to have the two-phase material pressure at room temperature be sufficient to provide the necessary clamping forces to provide thermal conduction between the adjacent structures. The forces exerted against the chassis 14 are directly proportional to the working pressure and the area of the expandable bladder 41 supported by the wall of the chassis 14. During implementation, the expandable bladder 41 is supported by both the enclosure card lock surface area and the area of the adjacent circuit card 12 over areas such as 1 cm×1 cm×25 cm. The expandable bladder 41 may also be physically attached to the circuit card 12 with mechanical fasteners such as screws, rivets, an adhesive, or similar devices. The pressure exerted against the surfaces is equal to the working fluid saturation pressure.

As illustrated in FIG. 5, the pressure exerted on the surface using ammonia as a working fluid, at an operating temperature of ~273K, would be 850-3284 kPa (123-476 psi). This provides a substantial clamping force, which can be expected to result in low interfacial thermal resistance. This is a strong function of the working fluid used, which can be selected based on the desired operating temperature and other factors.

Figure 6A:
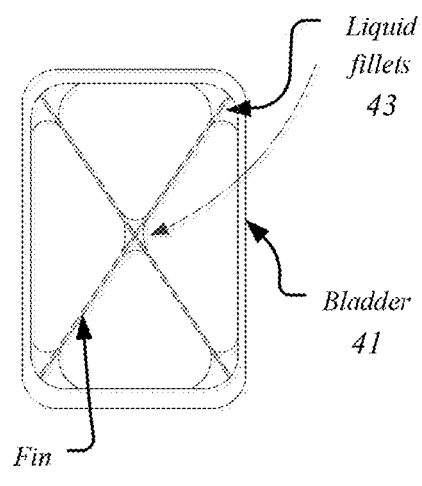
FIG. 6A illustrates an expandable bladder with internal ribs that form an "X" within the interior space of the expandable bladder according to one embodiment.
Figure 6B:
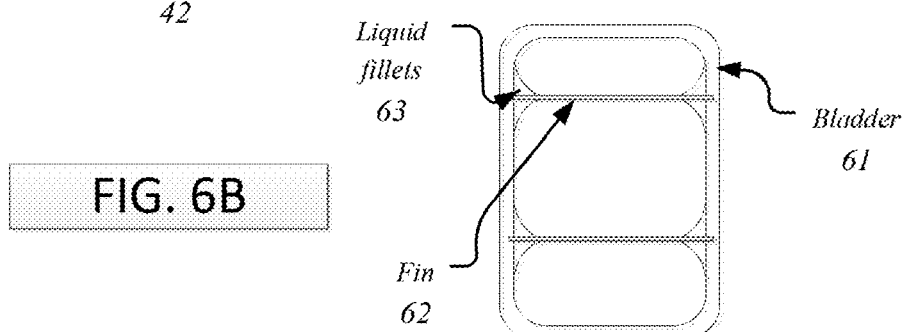
FIG. 6B illustrates an expandable bladder with internal ribs that are transverse across the interior space of the expandable bladder according to one embodiment.

FIG. 6A illustrates an expandable bladder 41 with internal ribs 42 that form an "X" within the interior space of the expandable bladder 41. FIG. 6B illustrates an expandable bladder 61 with two internal ribs 62 that are transverse across the interior space of the expandable bladder 61. In FIG. 6B, two internal ribs 62 are illustrated. However, less than two or more than two internal ribs 62 are contemplated by embodiments described herein.

Figure 6C:
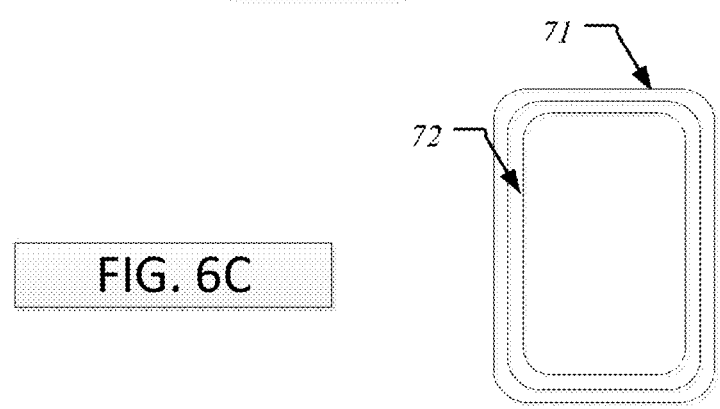
FIG. 6C is a cross-sectional view of an expandable bladder with a porous wick lining according to one embodiment.

FIG. 6C illustrates a cross-section of an expandable bladder 71, wherein the interior surface of the expandable bladder 71 has a porous wick lining 72. Porous wick lining 72—may be in addition to the internal ribs 42 or 62.

The geometries illustrated in FIGS. 6A-69 and the porous wick lining 72 of FIG. 6C capitalize on a natural wicking process. The geometries illustrated allow the working fluid to naturally wet into the small features and the curvatures to provide a capillary pumping, force. This force passively moves the working fluid from the cooling point where the liquid accumulates to create a flatter interface. The condensed fluid permeates to the warmer point where it evaporates and leaves the area. The wicking process continues in motion to remove heat from the PCB. Other geometries that capitalize on a natural wicking process using a two-phase material within an expandable bladder are contemplated by embodiments described herein.

The maximum capillary action, and hence, heat transport, is attained through the use of fillets 43 and 63 formed by internal, perforated surfaces within the volume of expandable bladder 41 or 61 illustrated in FIGS. 6A and 6B, respectively. These surfaces form fillets 43 and 63 where they meet the interior bladder wall. Fillets 43 and 63 enhance the flow of fluid due to capillary action, and can be designed to direct fluid flow along and transverse to the long axis of the 14 Smaller perforations allow cross flow of fluid between fillets 43 and 63. Larger perforations allow cross flow of vapor between volumes. In order to provide additional capillary pumping forces, a porous wick material can also be adhered to the inside walls of the bladder, such as porous wick lining 72. Such porous wicks are very often used in conventional (non-expanding) heat pipes, particularly in earth (gravity) based applications.

In addition to controlling the condensation and evaporation of the two-phase material as described herein, the pressure can also be controlled by the rate at which the two-phase material is injected and withdrawn into and out of the expandable bladders such as the system illustrated in FIG. 3B. As a result, the condensation and evaporation are further controlled in addition to the condensation and evaporation of the two-phase material.

Figure 7:
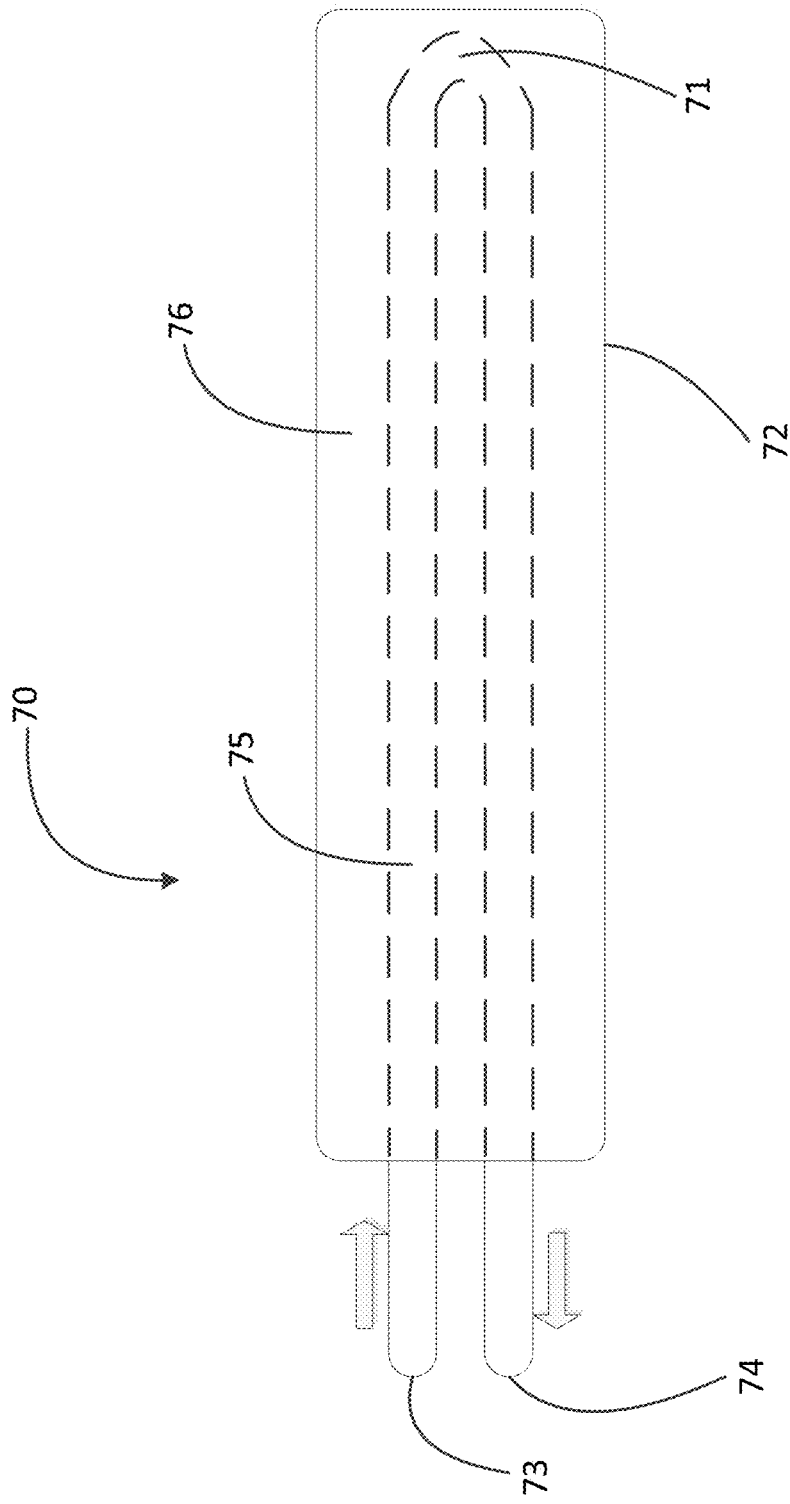
FIG. 7 illustrates an exemplary circuit card retainer having a continuous hose within an expandable bladder according to one embodiment.

FIG. 7 illustrates an exemplary embodiment of a circuit card retainer 70 having a continuous hose 71 within an expandable bladder 72. The continuous hose 71 extends from an inlet port 73 to an outlet port 74 of the expandable bladder 72. The inlet port 73 and outlet port 74 are connected to a pump (not illustrated in FIG. 7) for circulating a heat transfer single-phase fluid 75 within the continuous hose 71. In addition, the expandable bladder 72 also contains a two-phase material 76 within the volume of the expandable bladder 72 outside of the continuous hose 7L Therefore, the circuit card retainer 70 includes a first heat transfer system for a contained and pumped single-phase fluid 75 through the continuous hose 71 within the expandable bladder 72. The circuit card retainer 70 also includes a second heat transfer system utilizing the heat transfer via a two-phase material 76 within the volume of the expandable bladder 72 and outside of the continuous hose 71.

In one example, the two-phase material 76 is contained within the expandable bladder 72 and removes heat via a wicking process as described herein. In a second example, the working fluid is pumped in and out of the expandable bladder 72 and over a heat exchanger unit to form the two-phase material 76, such as illustrated in FIG. 3B. In the second example, the two-phase material 76 has a separate set of inlet and outlet ports in which to pump the two-phase material 76 into and out of the expandable bladder 72.

Embodiments described herein for a two-phase flexible card retainer have many applications, including space applications. Spacecraft typically use conductively-cooled electronics boxes to operate in the vacuum of space. As the electronics dissipate more heat, the mass and complexity of the packaging grow substantially. In order to provide removal and replacement of individual circuit card assemblies, they need to have a separable thermal interface. The entire enclosure needs to also have a separable thermal interface to the spacecraft. These interfaces usually represent the bottleneck for the flow of heat and also force larger thermal planes into the circuit card assembly. This increases mass and adds to structural failures of circuit card assemblies. Embodiments described herein can be used in various high-power avionics boxes, such as high-density processor units and power distribution units. These units can be used in both military and commercial communication satellites.

Figure 8:
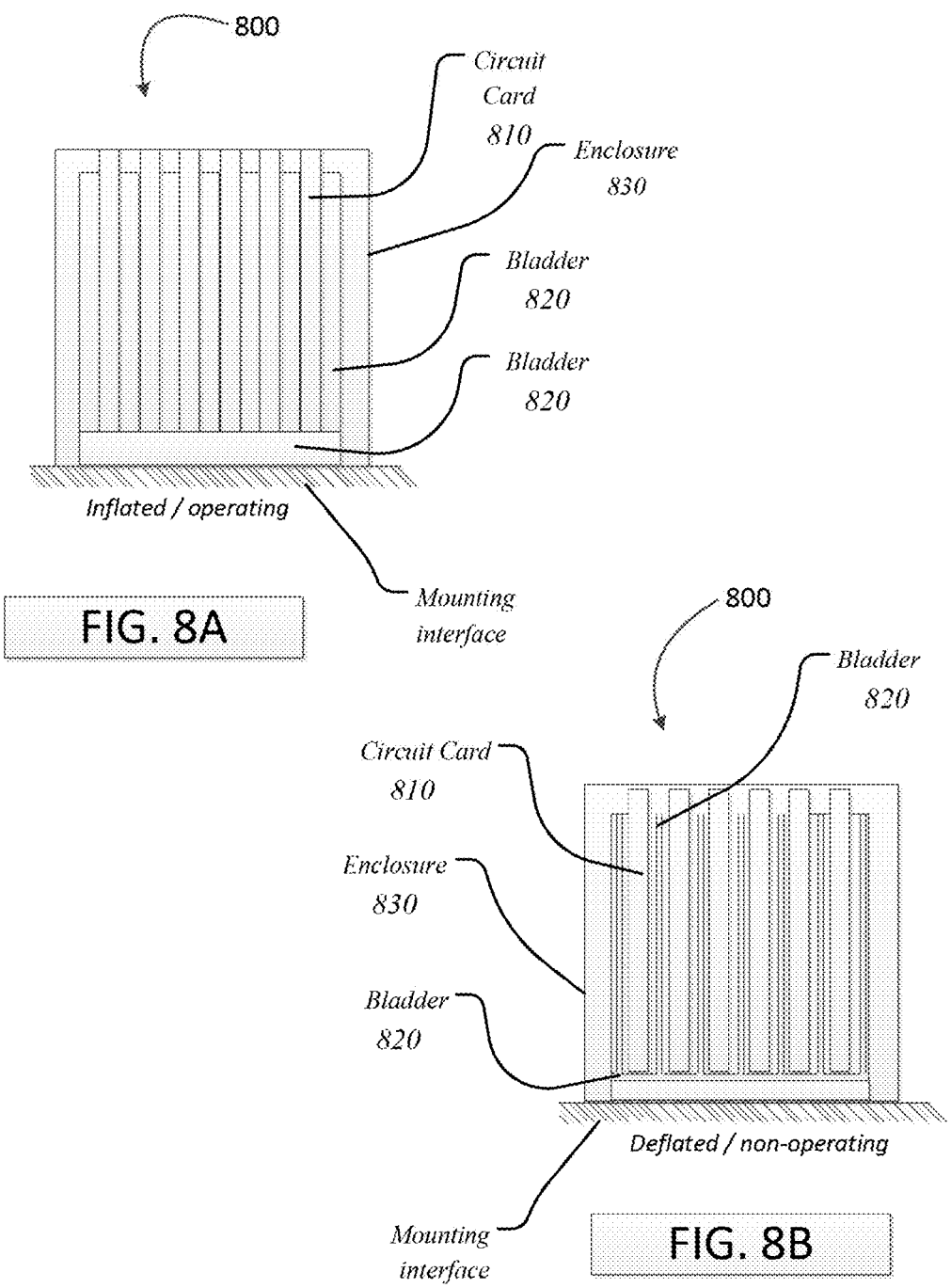
FIG. 8A illustrates an expandable bladder apparatus in an inflated/operational view according to one embodiment.
FIG. 8B illustrates an expandable bladder apparatus in a deflated/non-operational view according to one embodiment.

FIGS. 8A and 8B illustrate an expandable bladder apparatus 800 used to provide thermal convection and to enable a direct conductive interface to heat dissipating elements in an assembly of circuit cards 810. A continuous bladder 820 is positioned at a bottom side of an enclosure 830 and between each circuit card 810. The continuous bladder 820 is deflated on initial assembly and during connection of the circuit cards 810 into the enclosure 830 (FIG. 8B). After assembly, the continuous bladder 820 is charged with a fluid (FIG. 8A).

The continuous bladder 820 can be filled with a single-phase fluid for limited heat transfer. The continuous bladder 820 can also be filled with a two-phase material in a closed system and provide heat transfer as described herein. Heat transfer occurs as a result of evaporation taking place when the working fluid contacts a hot surface. The evaporation requires heat to be added to the working fluid, which comes from the electronic components cooled in the process. The purpose of the wicking mechanism is to keep the heat transfer process going. If the working fluid is evaporated on the hot surfaces and the working fluid is not replenished with "fresh" fluid, the evaporation process stops and the temperature increases very rapidly. This is commonly referred to as "dry out" in heat pipes. The wicking mechanism ensures that new, "fresh" fluid is brought into contact with the hot surfaces to keep the evaporation heat removal process going.

The continuous bladder 820 increases heat transfer from heat dissipating devices on the circuit cards 810 by directly interfacing with them, thereby eliminating thermal conduction through the PCB assembly. The continuous bladder 820 transfers heat directly to a mounting interface through the enclosed two-phase material. The continuous bladder 820 can be designed to penetrate the mounting interface, eliminating the need to provide a thermal interface material at the base of the enclosure 830. As the operating temperature of the PCB increases, the pressure between the continuous bladder 820 and mounting interface increases, the thermal performance is enhanced. In addition, the continuous bladder 820 absorbs shock and vibrations, thereby protecting the circuit cards from potentially damaging external shock and vibration events.

Figure 9:
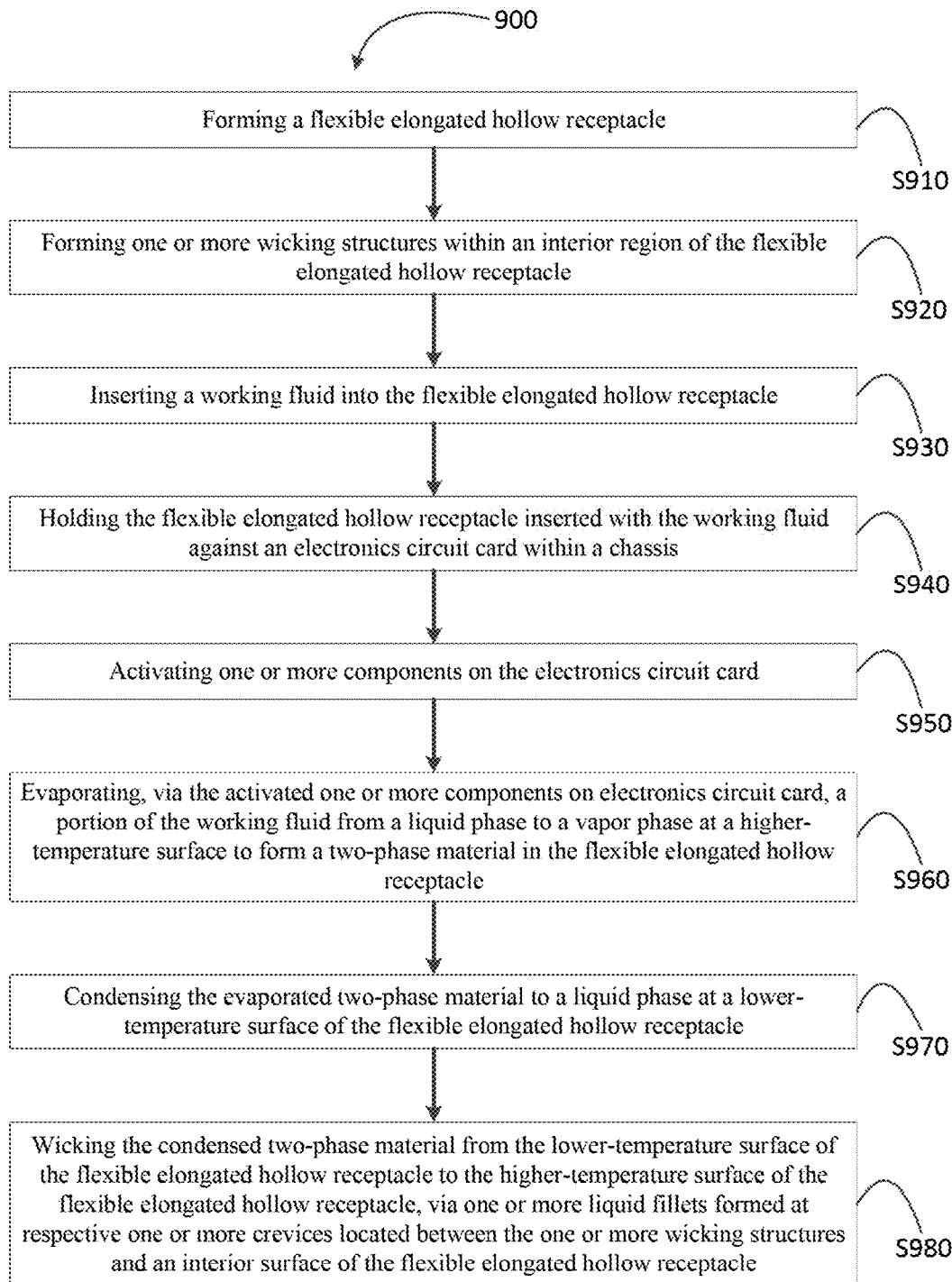
FIG. 9 is a flowchart of an exemplary method for cooling an electronics circuit card according to one embodiment.

FIG. 9 is a flowchart of an exemplary method 900 for cooling an electronics circuit card. In step S910, a flexible elongated hollow receptacle is formed. In one embodiment, the flexible elongated hollow receptacle can be formed of a high-density polyethylene material.

In step S920, one or more wicking structures within an interior region of the flexible elongated hollow receptacle are formed. In one embodiment, the one or more wicking structures include a porous material.

In step S930, a working fluid is inserted into the flexible elongated hollow receptacle. In one embodiment, the working fluid exhibits a liquid phase within a first temperature/pressure range and the working fluid exhibits a vapor phase within a second temperature/pressure range.

In step S940, the flexible elongated hollow receptacle inserted with the working fluid is held against an electronics circuit card within a chassis. In one embodiment, a contiguous plurality of flexible elongated hollow receptacles is retained against a surface of a corresponding plurality of electronics circuit cards within the chassis.

In step S950, one or more components on the electronics circuit card are activated. Activation of the one or more components produces heat.

In step S960, a portion of the working fluid is evaporated from a liquid phase to a vapor phase at a higher-temperature surface to form a two-phase material in the flexible elongated hollow receptacle. The higher-temperature surface of the flexible elongated hollow receptacle is pressed against the electronics circuit card. The evaporating is executed by one or snore of the activated components on the electronics circuit card.

In step S970, the evaporated two-phase material is condensed to a liquid phase at a lower-temperature surface of the flexible elongated hollow receptacle. The lower-temperature surface of the flexible elongated hollow receptacle is the surface opposite from the electronics circuit card.

In step S980, the condensed two-phase material is wicked from the lower-temperature surface of the flexible elongated hollow receptacle to the higher-temperature surface of the flexible elongated hollow receptacle. The wicking is executed via one or more liquid fillets formed at respective one or more crevices located between the one or more wicking structures and an interior surface of the flexible elongated hollow receptacle or by means of a porous wick within the interior structure of the flexible elongated hollow receptacle.

The flexibility of an expandable bladder provides a vast improvement over conventional circuit card retainers. A metal circuit card retainer has a very small tolerance in changes to its size. If the metal circuit card retainer expands in volume due to a temperature increase, it could cause damage to the PCB. If the metal circuit card retainer contracts due to a temperature decrease, it could reduce the contact pressure to nearly zero, greatly increasing the thermal resistance at the interface, and potentially, even pop out of the slot of the chassis if it is not mechanically fastened to the circuit card. In contrast, embodiments described herein continue to provide pressure against all walls of the slot and the PCB to provide heat transfer of the PCB. This provides a more positive locking feature than a one-time press fit between the walls of the slot.

Systems and methods described herein reduce interfacial thermal resistance between a circuit card and its chassis by increasing heat transfer from the circuit card utilizing evaporative two-phase heat transfer. The expandable bladder removes heat directly from the circuit card and into the circulating two-phase fluid. This removes the need to transfer heat through the circuit card and chassis interface, which results in reduced circuit card temperatures.

The expandable bladder can be designed to penetrate the circuit card and chassis mounting interface. This reduces conduction losses in the chassis wall and the thermal interface material at the base of the chassis. As the operating temperature increases, the clamping pressure at the expandable bladder and chassis interface increases, due to increased fluid evaporation to improve thermal performance. The relationship between an operating temperature increase and a corresponding pressure increase is governed by the type of working fluid selected, via its saturation curve.

The flexible expandable bladder also provides a uniform clamping distribution to the PCB. Since the pressure of the two-phase fluid is homogenous within the heat transfer system, the same clamping force exists along the entire length of the slot within the chassis.

In addition, the flexibility of the expandable bladder dampens substantial shock and/or vibration to the PCB. Therefore, damage to the PCB from external shock and vibration is minimized.

Embodiments described herein include the following aspects.

(1) An electronics circuit card retainer includes a flexible elongated hollow receptacle; a working fluid disposed within the flexible elongated hollow receptacle; and a flow circulator configured to circulate the working fluid within the flexible elongated hollow receptacle and expand the flexible elongated hollow receptacle against an electronics circuit card within the electronics circuit card retainer.

(2) The electronics circuit card retainer of (1), wherein the working fluid exhibits a liquid phase within a first temperature/pressure range and the working fluid exhibits a vapor phase within a second temperature/pressure range.

(3) The electronics circuit card retainer of either one of (1) or (2), wherein the working fluid includes one of butane, $CH_5N$, propane, methanol, propylene, acetone, ammonia, HFE7000, and water.

(4) The electronics circuit card retainer of any one of (1) through (3), wherein the flow circulator includes one or more wicking structures formed within an interior hollow region of the flexible elongated hollow receptacle.

(5) The electronics circuit card retainer of any one of (1) through (4), wherein the one or more wicking structures include crevices formed at an intersection with, the flexible elongated hollow receptacle.

(6) The electronics circuit card retainer of any one of (1) through (5), wherein the one or more wicking structures include a porous material.

(7) The electronics circuit card retainer of any one of (1) through (6), wherein the one or more wicking structures are configured to circulate a liquid phase of the working fluid from a lower-temperature surface of the flexible elongated hollow receptacle to a higher-temperature surface of the flexible elongated hollow receptacle, via a capillary force of the one or more wicking structures.

(8) The electronics circuit card retainer of any one of (1) through (7), further includes a chassis configured to hold the flexible elongated hollow receptacle against the electronics circuit card.

(9) The electronics circuit card retainer of any one of (1) through (8), wherein the flow circulator includes an external cooling receptacle and a pumping mechanism configured to circulate the working fluid into and out of the flexible elongated hollow receptacle.

(10) An electronics circuit card system includes a flexible elongated hollow receptacle; a working fluid disposed within the flexible elongated hollow receptacle; one or more wicking structures formed within an interior hollow region of the flexible elongated hollow receptacle, wherein the one or more wicking structures are configured to circulate the working fluid within the flexible elongated hollow receptacle and expand the flexible elongated hollow receptacle against an electronics circuit card; and a chassis configured to hold the flexible elongated hollow receptacle against the electronics circuit card.

(11) The electronics circuit card system of (10), wherein the one or more wicking structures include crevices formed at an intersection with the flexible elongated hollow receptacle.

(12) The electronics circuit card system of either one of (10) or (11), wherein the one or more wicking structures include a porous material.

(13) The electronics circuit card system of any one of (10) through (12), wherein the one or more wicking structures are configured to circulate a liquid phase of the working fluid from a lower-temperature surface of the flexible elongated hollow receptacle to a higher-temperature surface of the flexible elongated hollow receptacle, via a capillary force of the one or more wicking structures.

(14) The electronics circuit card system of any one of (10) through (13), wherein the working fluid exhibits a liquid phase within a first temperature/pressure range and the working fluid exhibits a vapor phase within a second temperature/pressure range.

(15) The electronics circuit card system of any one of (10) through (14), further includes a contiguous plurality of flexible elongated hollow receptacles configured to be retained against a surface of a corresponding plurality of electronics circuit cards within the chassis.

(16) The electronics circuit card system of any one of (10) through (15), wherein the working fluid circulates within and between the contiguous plurality of flexible elongated hollow receptacles.

(17) A method for cooling an electronics circuit card includes forming a flexible elongated hollow receptacle; forming one or more wicking structures within an interior region of the flexible elongated hollow receptacle; inserting a working fluid into the flexible elongated hollow receptacle; holding the flexible elongated hollow receptacle inserted with the working fluid against an electronics circuit card within a chassis; activating one or more components on the electronics circuit card; evaporating, via the activated one or more components on electronics circuit card, a portion of the working fluid from a liquid phase to a vapor phase at a higher-temperature surface to form a two-phase material in the flexible elongated hollow receptacle; condensing the evaporated two-phase material to a liquid phase at a lower-temperature surface of the flexible elongated hollow receptacle; and wicking the condensed two-phase material from the lower-temperature surface of the flexible elongated hollow receptacle to the higher-temperature surface of the flexible elongated hollow receptacle, via one or more liquid fillets formed at respective one or more crevices located between the one or more wicking structures and an interior surface of the flexible elongated hollow receptacle.

(18) The method for cooling an electronics circuit card of (17), further includes forming the one or more wicking structures with a porous material.

(19) The method for cooling an electronics circuit card of either one of (17) or (18), further includes laminating a porous wicking structure to the interior surface of the flexible elongated hollow receptacle.

(20) The method for cooling an electronics circuit card of any one of (17) through (19), further includes forming the flexible elongated hollow receptacle with a high-density polyethylene material.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components.

The foregoing discussion describes merely exemplary embodiments of the present disclosure. As will be understood by those skilled in the art, the present disclosure may be embodied in other specific forms without departing from the spirit or essential characteristics thereof. Accordingly, the disclosure is intended to be illustrative, but not limiting of the scope of the disclosure. The disclosure, including any readily discernible variants of the teachings herein, defines in part, the scope of the foregoing claim terminology such that no inventive subject matter is dedicated to the public.

The invention claimed is:

1. An electronics circuit card retainer, comprising:
a closed, pre-charged flexible elongated hollow bladder configured to be provided in a slot to hold and retain at least a portion of an electronics circuit card in the slot;
a working fluid disposed within the closed, pre-charged flexible elongated hollow bladder, the working fluid being a predetermined pre-charged amount of working fluid disposed within the closed, pre-charged flexible elongated hollow bladder;
a flow circulator configured to circulate the working fluid within the closed, pre-charged flexible elongated hollow bladder without use of an active fluid delivery system when the closed, pre-charged flexible elongated hollow bladder is expanded against said at least the portion of the electronics circuit card provided in the slot; and
a chassis configured to hold the closed, pre-charged flexible elongated hollow bladder against said at least the portion of the electronics circuit card when the closed, pre-charged flexible elongated hollow bladder is fully in the slot and the electronics circuit card is at least partially in the slot such that the closed, pre-charged flexible elongated hollow bladder is between and in direct contact with the chassis and said at least the portion of the electronics circuit card,
wherein the working fluid is configured to exhibit a liquid phase within a first temperature/pressure range and a vapor phase within a second temperature/pressure range, and
wherein said at least the portion of the electronics circuit card against which the closed, pre-charged flexible elongated hollow bladder is held in direct contact is an entire length of a side surface of the electronics circuit card at a periphery of the electronics circuit card, and
wherein no portion of the closed, pre-charged flexible elongated hollow bladder extends from the slot.

2. The electronics circuit card retainer of claim 1, wherein the working fluid includes one of butane, $CH_5N$, propane, methanol, propylene, acetone, ammonia, HFE7000, and water.

3. The electronics circuit card retainer of claim 1, wherein the flow circulator includes one or more wicking structures formed within an interior hollow region of the closed, pre-charged flexible elongated hollow bladder.

4. The electronics circuit card retainer of claim 3, wherein the one or more wicking structures include crevices formed at an intersection with the closed, pre-charged flexible elongated hollow bladder.

5. The electronics circuit card retainer of claim 3, wherein the one or more wicking structures include a porous material.

6. The electronics circuit card retainer of claim 3, wherein the one or more wicking structures are configured to circulate the liquid phase of the working fluid from a lower-temperature surface of the closed, pre-charged flexible elongated hollow bladder to a higher-temperature surface of the closed, pre-charged flexible elongated hollow bladder, via a capillary force of the one or more wicking structures.

7. An electronics circuit card system, comprising:
a flexible elongated hollow bladder;
a predetermined amount of working fluid disposed within the flexible elongated hollow bladder, the flexible elongated bladder being closed and precharged with the predetermined amount of working fluid;
one or more wicking structures formed within an interior hollow region of the flexible elongated hollow bladder, wherein the one or more wicking structures are configured to circulate the working fluid within the flexible elongated hollow bladder without use of an active fluid delivery system when the flexible elongated hollow bladder is expanded against an electronics circuit card; and
a chassis configured to hold the flexible elongated hollow bladder against the electronics circuit card when the flexible elongated hollow bladder is expanded against an electronics circuit card such that the flexible elongated hollow bladder is in direct contact with a portion of the electronics circuit card and the chassis,
wherein an entirety of the flexible elongated hollow bladder is in a slot defined by the chassis such that all of the flexible elongated hollow bladder is between the chassis and the portion of the electronics circuit card to hold the flexible elongated hollow bladder against the electronics circuit card, and
wherein no portion of the flexible elongated hollow bladder extends from the slot.

8. The electronics circuit card system of claim 7, wherein the one or more wicking structures include crevices formed at an intersection with the flexible elongated hollow bladder.

9. The electronics circuit card system of claim 7, wherein the one or more wicking structures include a porous material.

10. The electronics circuit card system of claim 7, wherein the one or more wicking structures are configured to circulate a liquid phase of the working fluid from a lower-temperature surface of the flexible elongated hollow bladder to a higher-temperature surface of the flexible elongated hollow bladder, via a capillary force of the one or more wicking structures.

11. The electronics circuit card system of claim 7, wherein the working fluid exhibits a liquid phase within a first temperature/pressure range and the working fluid exhibits a vapor phase within a second temperature/pressure range.

12. A method for cooling an electronics circuit card, the method comprising:
forming a flexible, continuous elongated hollow bladder having a first portion and a second portion in direct physical and fluid communication with each other, the first and second portions being provided at a right angle relative to each other, and the flexible, continuous elongated hollow bladder being configured to be closed and precharged with a predetermined amount of working fluid;
forming one or more wicking structures within an interior region of the flexible, continuous elongated hollow bladder;
precharging the predetermined amount of working fluid into the flexible, continuous elongated hollow bladder;
holding the flexible, continuous elongated hollow bladder inserted with the predetermined amount of working fluid against a plurality electronics circuit cards within a chassis such that the first portion of the flexible, continuous elongated hollow bladder is directly against one of the electronic circuit cards and the second portion of the flexible, continuous elongated hollow bladder is against said one of the electric circuit cards and at least one additional electronic circuit card of the plurality;
activating one or more components on the electronics circuit cards;
evaporating, via the activated one or more components on the electronics circuit cards, a portion of the predetermined amount of working fluid from a liquid phase to a vapor phase at a higher-temperature surface to form a two-phase material in the flexible, continuous elongated hollow bladder;

condensing the evaporated two-phase material to a liquid phase at a lower-temperature surface of the flexible, continuous elongated hollow bladder; and wicking the condensed two-phase material from the lower-temperature surface of the flexible, continuous elongated hollow bladder to the higher-temperature surface of the flexible, continuous elongated hollow receptacle, via one or more liquid fillets formed at respective one or more crevices located between the one or more wicking structures and an interior surface of the flexible, continuous elongated hollow bladder.

13. The method of claim 12, further comprising:
forming the one or more wicking structures with a porous material.

14. The method of claim 12, further comprising:
laminating a porous wicking structure to the interior surface of the flexible, continuous elongated hollow bladder.

15. The method of claim 12, further comprising:
forming the flexible, continuous elongated hollow bladder with a high-density polyethylene material.

\* \* \* \* \*